United States Patent
Choi

(10) Patent No.: US 6,894,356 B2
(45) Date of Patent: May 17, 2005

(54) SRAM SYSTEM HAVING VERY LIGHTLY DOPED SRAM LOAD TRANSISTORS FOR IMPROVING SRAM CELL STABILITY AND METHOD FOR MAKING THE SAME

(75) Inventor: Jeong Yeol Choi, Portland, OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/099,520

(22) Filed: Mar. 15, 2002

(65) Prior Publication Data

US 2003/0173625 A1 Sep. 18, 2003

(51) Int. Cl.$^7$ ............................................. H01L 29/76
(52) U.S. Cl. ................... 257/393; 257/369; 257/371; 257/344; 257/346; 257/391; 257/392; 257/407; 257/408; 438/153; 438/154; 438/199; 438/231; 438/232; 438/279; 438/299
(58) Field of Search ................................. 257/393, 344, 257/346, 369, 371, 391, 392, 407, 408; 438/152, 282, 155, 153, 154, 231, 232, 279, 532, 210, 237, 911, 199

(56) References Cited

U.S. PATENT DOCUMENTS

| | | | |
|---|---|---|---|
| 5,497,023 A | * | 3/1996 | Nakazato et al. ............ 257/394 |
| 5,589,701 A | | 12/1996 | Baldi |
| 5,668,770 A | * | 9/1997 | Itoh et al. .................... 365/227 |
| 5,780,330 A | | 7/1998 | Choi |
| 5,804,477 A | | 9/1998 | Lien |
| 6,031,267 A | | 2/2000 | Lien |
| 6,191,460 B1 | * | 2/2001 | Choi et al. ................... 257/393 |

\* cited by examiner

*Primary Examiner*—Matthew Smith
*Assistant Examiner*—B. V. Keshavan
(74) *Attorney, Agent, or Firm*—Bever, Hoffman & Harms, LLP

(57) ABSTRACT

A static random access memory (SRAM) cell is given increased stability and latch-up immunity by fabricating the PMOS load transistors of the SRAM cell to have a very low drain/source dopant concentration. The drain/source regions of the PMOS load transistors are formed entirely by a P-- blanket implant. The PMOS load transistors are masked during subsequent implant steps, such that the drain/source regions of the PMOS load transistors do not receive additional P-type (or N-type) dopant. The P-- blanket implant results in PMOS load transistors having drain/source regions with dopant concentrations of 1e17 atoms/cm$^3$ or less. The dopant concentration of the drain/source regions of the PMOS load transistors is significantly lower than the dopant concentration of lightly doped drain/source regions in PMOS transistors used in peripheral circuitry.

17 Claims, 9 Drawing Sheets

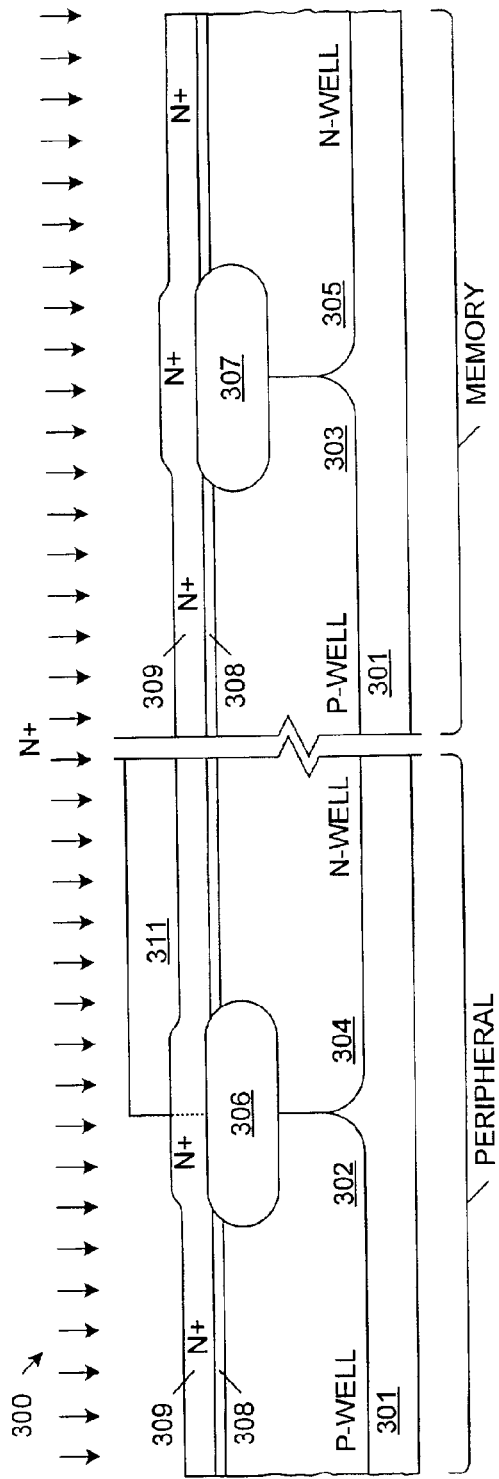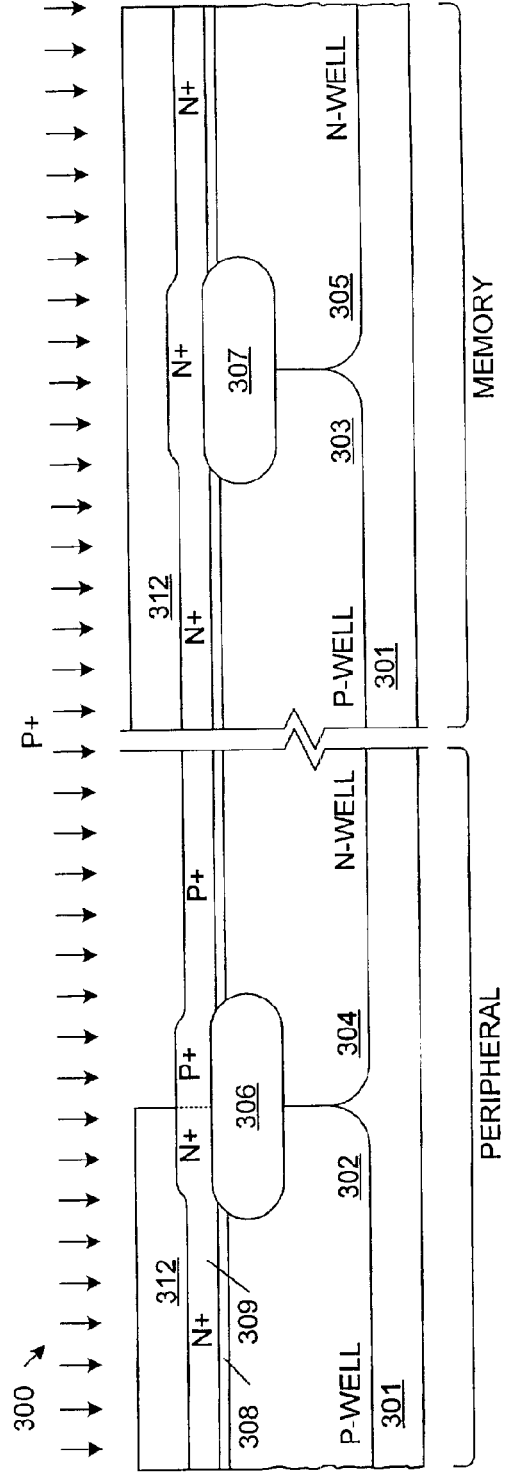

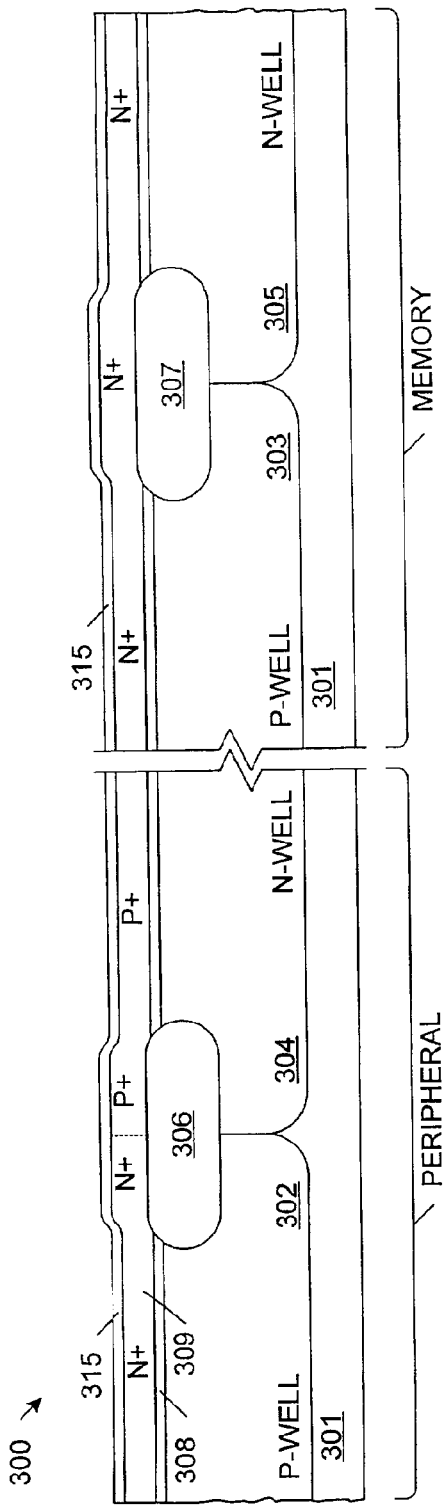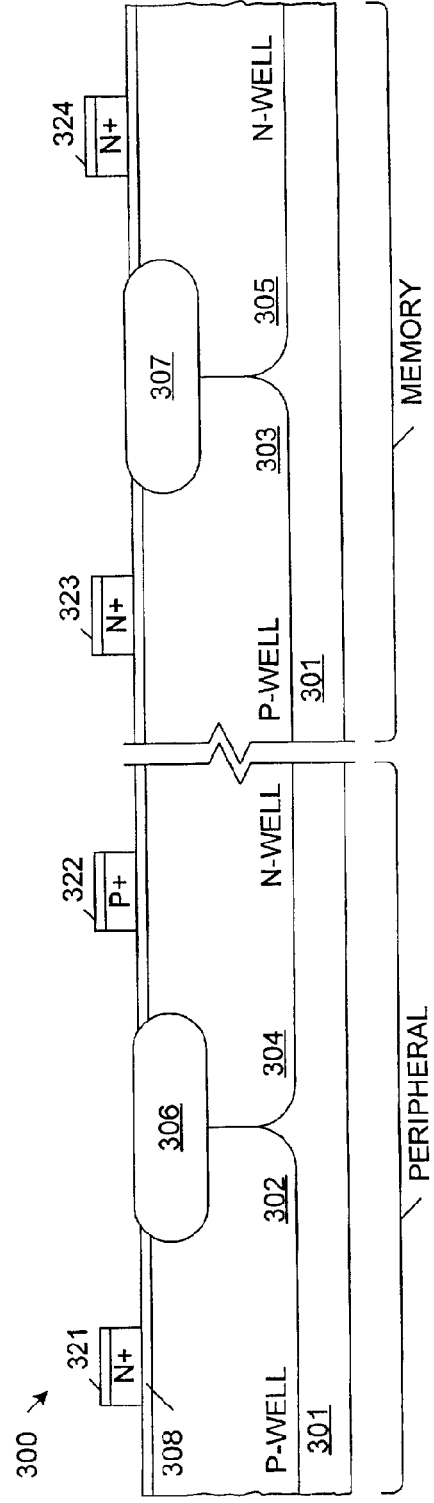

SRAM SYSTEM HAVING VERY LIGHTLY DOPED SRAM LOAD TRANSISTORS FOR IMPROVING SRAM CELL STABILITY AND METHOD FOR MAKING THE SAME

BACKGROUND

1. Field of the Invention

This invention relates to semiconductor integrated circuit memory devices, and more particularly to devices implementing static random access memory (SRAM) cells having load transistors.

2. Related Art

FIG. 1 is a schematic drawing of a conventional memory circuit 100 that includes six-transistor (6T) static random access memory (SRAM) cell 101 fabricated using cross-connected complementary metal oxide semiconductor (CMOS) inverters. SRAM cell 101 includes N-type MOS (NMOS) transistors N1, N2, N3, and N4, and P-type MOS (PMOS) transistors P1 and P2, which are connected as illustrated. Transistors P1 and N1 are coupled to form inverter 110, and transistors P2 and N2 are coupled to form inverter 111. These inverters 110–111 are cross-coupled, thereby forming a latch circuit that stores a data bit. As described below, the stability of this latch circuit can be improved by making PMOS transistors P1 and P2 weaker.

Although only a single SRAM cell 101 is illustrated in FIG. 1, it is understood that many SRAM cells identical to SRAM cell 101 are typically configured in an array. The transistors located in the SRAM cells of such a memory array are hereinafter referred to as "memory" transistors. Thus, SRAM cell 101 includes PMOS memory transistors P1–P2 and NMOS memory transistors N1–N4.

Memory circuit 100 also includes control circuit 102, sensing circuit 103, complementary bit lines 120–121 and word line 122, which are coupled to SRAM cell 101 as illustrated. The operation of control circuit 102 and 103 are well known to those of ordinary skill in the art. Control circuit 102 and sensing circuit 103 typically contain both NMOS and PMOS transistors in a variety of conventional configurations. These transistors, and other transistors located outside of the memory array, are hereinafter referred to as "peripheral" transistors.

Stability is defined as the ability of a memory cell to retain its programmed state. SRAM cell stability is therefore desirable. However, as SRAM cells become smaller, and the SRAM cell operating voltages are reduced to 2.5 Volts and lower, it can become difficult to maintain SRAM cell stability. The stability of 6T SRAM cell 101 can be enhanced by reducing the drain-source current ($I_{DS}$) in the pull-up PMOS memory transistors P1 and P2 when these transistors are in a conductive state. Reducing the drain-source current $I_{DS}$ in PMOS memory transistors P1 and P2 will also reduce the power consumption of the associated memory array. One method of reducing the current $I_{DS}$ is to make PMOS transistors P1 and P2 "weaker" (or less conductive). While weaker transistors switch relatively slowly, PMOS memory transistors P1–P2 are used as load transistors, such that the speed of these transistors does not adversely affect the speed of SRAM cell 101.

One way of making a PMOS transistor weaker is to lightly dope the source and/or drain regions of the PMOS transistor. Another way of making a PMOS transistor weaker in a dual-gate process is to fabricate the PMOS transistor with an N+ type gate electrode. A PMOS transistor having an N+ type gate will have a higher threshold voltage ($V_T$) and a lower drain-source current ($I_{DS}$) than a similar PMOS transistor having a P+ type gate.

While it is desirable for PMOS memory transistors to be weak, it is generally undesirable for PMOS peripheral transistors to be weak, because weak PMOS peripheral transistors will decrease the operating speed of the peripheral circuitry (e.g., control circuit 102 and sensing circuit 103). Thus, some memory circuits use PMOS peripheral transistors having P+ type gates, because the lower threshold voltage ($V_T$) and higher drain-source current ($I_{DS}$) of such PMOS transistors increases operating speed.

FIG. 2 is a simplified cross-sectional view showing a conventional CMOS structure 200 that includes relatively weak PMOS memory transistor P1, NMOS memory transistor N1, relatively strong PMOS peripheral transistor P11 and NMOS peripheral transistor N11. CMOS structure 200 includes semiconductor substrate 201, P-wells 202–203, N-wells PMOS 204–205, field oxide regions 206–207, gate oxide layer 208, P– type lightly doped drain/source (LDD) regions 209, heavily doped P+ drain/source regions 210, N-type LDD regions 211, heavily doped N+ drain/source regions 212, P+ type gate electrode 220, N+ type gate electrodes 221–223, and sidewall spacers 225.

PMOS memory transistor P1 is a relatively weak transistor in view of N+ type gate electrode 223, P– type LDD regions 209, and the absence of heavily doped P+ drain/source regions 210. PMOS peripheral transistor P11 is a relatively strong transistor in view of P+ gate electrode 220, P– type LDD regions 209, and P+ type drain/source regions 210. The P– type LDD regions 209 of PMOS transistors P1 and P11 are formed at the same time, and therefore have the same dopant concentration. Because PMOS transistor P11 is a surface channel device, this transistor requires a relatively high P– LDD dose in order to achieve an acceptable current driving capability ($I_{DS}$). Because PMOS transistor P1 receives the same relatively high P– LDD dose, PMOS transistor P1 may exhibit an undesirably high current driving capability ($I_{DS}$), thereby deteriorating cell stability, and possibly necessitating a larger cell size to make the cell more stable. CMOS structure 200 is described in more detail in U.S. Pat. No. 6,191,460.

Although CMOS structure 200 demonstrates lowered current $I_{DS}$ and improved stability with respect to previously known 6T SRAM memory circuits, it would be desirable to have a CMOS structure that further reduces the current driving capability ($I_{DS}$) and enhances memory cell stability. It would also be desirable if such a CMOS structure could be fabricated without significantly modifying the standard CMOS process flow.

SUMMARY

In accordance with the invention, a conventional CMOS process flow is modified slightly to create PMOS memory transistors having an increased threshold voltage and a reduced current driving capability. The modified CMOS process flow does not adversely affect the characteristics of other NMOS or PMOS transistors in the memory circuit.

In accordance with the present invention, the drain/source regions of PMOS memory transistors are fabricated entirely by a P–– type blanket implant. This P–– blanket implant does not require a mask, so no additional mask requirements are imposed on a conventional CMOS process flow. The P–– blanket implant results in PMOS memory transistor drain/source regions having a dopant concentration on the order of 1e17 atoms/cm$^3$ or less. The PMOS memory transistors are covered by implant masks during subsequent implant steps, thereby preventing additional P-type (or N-type) dopant from entering the drain/source regions of the PMOS memory transistors. The very low P-- drain/source doping causes the PMOS memory transistors to exhibit a high threshold voltage and a low current driving capability. Accordingly, memory cell stability and latch-up immunity are enhanced.

In one embodiment, a P- LDD implant mask is formed after the P-- blanket implant is performed. The P- LDD implant mask covers the PMOS memory transistors, the NMOS memory transistors and the NMOS peripheral transistors, but exposes the PMOS peripheral transistors. Note that the P- LDD implant mask typically exposes the PMOS memory transistors in a conventional CMOS process flow. Thus, the P- LDD implant mask of the present invention is slightly modified with respect to a conventional CMOS process flow.

A P- LDD implant is performed through the P- LDD implant mask, thereby forming the P- LDD regions of the PMOS peripheral transistors. The P- LDD regions of the PMOS peripheral transistors therefore include dopants from both the P-- blanket implant and the P- LDD implant. In one embodiment, the dosage of the P- LDD implant is about 10 to 100 times larger than the dosage of the P-- blanket implant. As a result, the PMOS peripheral transistors advantageously exhibit a relatively low threshold voltage and a relatively high current driving capability.

An N- LDD implant is also performed through an N- LDD implant mask, thereby forming the N- LDD regions of the NMOS memory and peripheral transistors. The P--, P- LDD and N- LDD implants may be performed in any order between the formation of the gate electrodes and the formation of sidewall spacers adjacent to the gate electrodes.

In one embodiment, the PMOS memory transistors are fabricated with N-type gate electrodes, thereby further weakening the PMOS memory transistors. The NMOS memory and peripheral transistors are fabricated with N-type gates, and the PMOS peripheral transistors are fabricated with P-type gates.

The present invention will be more fully understood in view of the following description and drawings.

BRIEF DESCRIPTION OF THE DRAWINGS

FIGS. 4A–4J are cross-sectional views showing various stages of a fabrication process in accordance with one embodiment of the present invention.

DETAILED DESCRIPTION

Figure 3:
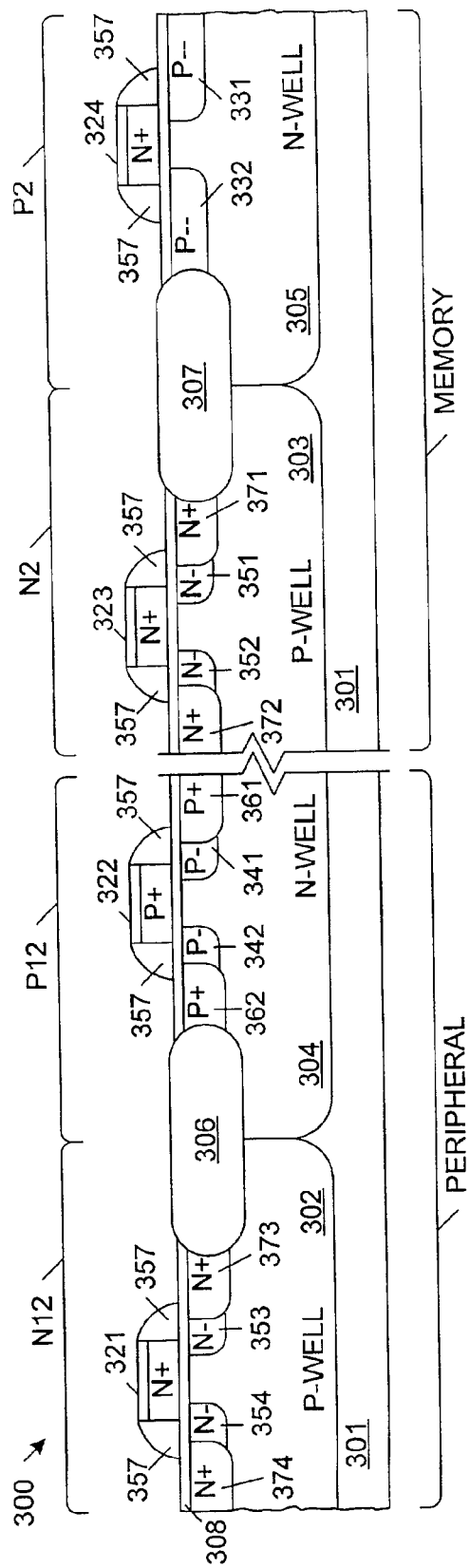
FIG. 3 is a cross sectional view of a CMOS structure that includes an improved set of transistors that may be used in the memory circuit 100 of FIG. 1 in accordance with one embodiment of the present invention.

FIG. 3 is a cross sectional view of a CMOS structure 300 that includes an improved set of transistors that may be used in memory circuit 100 (FIG. 1) in accordance with one embodiment of the present invention. CMOS structure 300 is fabricated on a semiconductor substrate 301, and include NMOS peripheral transistor N12 and PMOS peripheral transistor P12 fabricated in a first region (labeled PERIPHERAL), and NMOS memory transistor N2 and PMOS memory transistor P2 fabricated in a second region (labeled MEMORY).

More specifically, NMOS peripheral transistor N12 is fabricated in P-well 302, and includes N- LDD regions 353–354, N+ drain/source regions 373–374, gate dielectric layer 308, N+ gate electrode 321, and sidewall spacers 357. PMOS peripheral transistor P12 is fabricated in N-well 304, and includes P- LDD regions 341–342, P+ drain/source regions 362–361, gate dielectric layer 308, P+ gate electrode 322, and sidewall spacers 357. NMOS and PMOS peripheral transistors N12 and P12 are isolated by field oxide region 306.

NMOS memory transistor N2 is fabricated in P-well 303, and includes N- LDD regions 351–352, N+ drain/source regions 371–372, gate dielectric layer 308, N+ gate electrode 323, and sidewall spacers 357. PMOS memory transistor P2 is fabricated in N-well 305, and includes P-- drain/source regions 331–332, gate dielectric layer 308, N+ gate electrode 324, and sidewall spacers 357. NMOS and PMOS memory transistors N2 and P2 are isolated by field oxide region 307. Transistors N2–P2 and N12–P12 as described herein are preferably symmetrical but may be asymmetrical in other embodiments.

Figure 1:
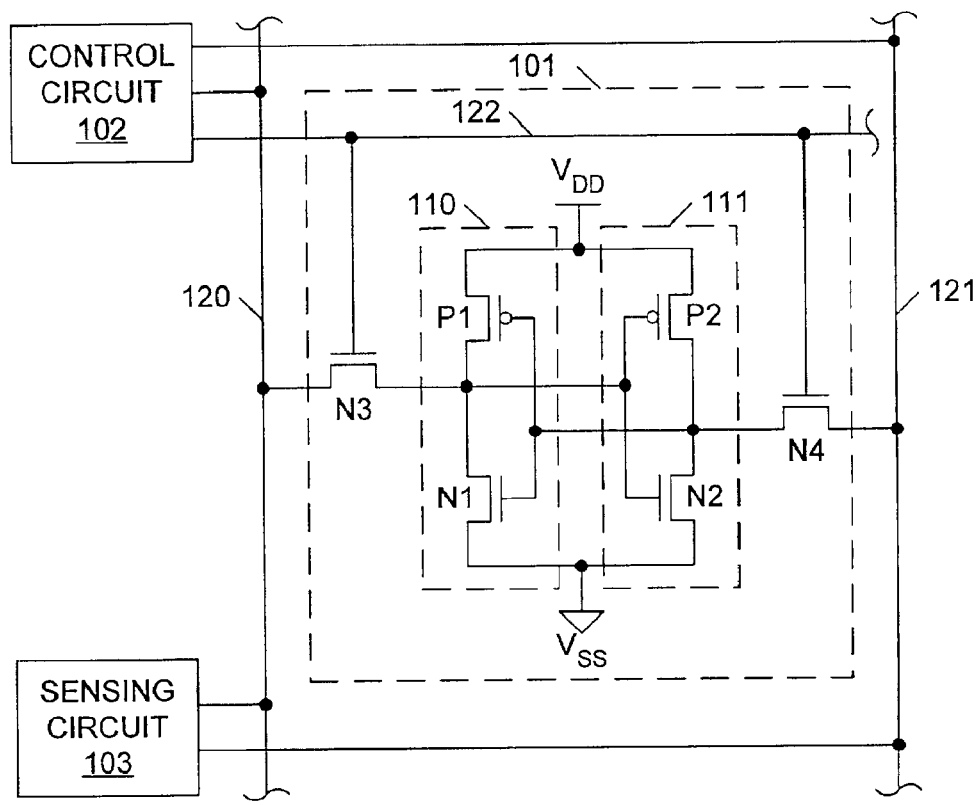
FIG. 1 is a circuit diagram of a conventional memory circuit that includes a six-transistor static random access memory cell, a control circuit and a sensing circuit.

In the described embodiment, peripheral transistors N12 and P12 correspond with transistors located in the peripheral circuitry of memory circuit 100 (e.g., transistors located in control circuit 102 and/or sensing circuit 103 of FIG. 1). NMOS memory transistor N2 corresponds with the NMOS transistors located in the memory array of memory circuit 100 (e.g., transistors N1–N4 of FIG. 1). PMOS memory transistor P2 corresponds with the PMOS transistors located in the memory array of memory circuit 100 (e.g., transistors P1–P2 of FIG. 1).

In accordance with the present invention, a memory circuit including PMOS and NMOS memory transistors P2 and N2 and PMOS and NMOS peripheral transistors P12 and N12 is fabricated using a process that adds a very light P-- type blanket implant step to a conventional CMOS process flow. This very light P-- type blanket implant is used to create the drain/source regions of PMOS memory transistors, such that the drain/source regions of the PMOS memory transistors are much more lightly doped than in conventional PMOS memory transistors. Thus, PMOS memory transistor P2 exhibits very lightly doped P-- drain/source regions 331 and 332. In the present description, very lightly doped P-- regions are defined as regions having a p-type dopant concentration on the order of about 1e17 atoms per cubic centimeter (atoms/cm$^3$) or less. PMOS peripheral transistors are fabricated to additionally include a P- type LDD implant and a P+ type implant. Thus, PMOS peripheral transistor P12 exhibits P- LDD regions 341–342, and P+ type regions 361–362. In the described embodiment, P- LDD regions are defined as regions having a p-type dopant concentration between about 1e18 atoms/cm$^3$ and 1e19 atoms/cm$^3$. Thus, in the described embodiment, the p-type dopant concentration of P- LDD regions 341–342 is 10 to 100 times greater than the p-type dopant concentration of P-- drain/source regions 331–332. In other embodiments, p-type dopant concentration of P- LDD regions 341–342 may be 2–3 to 100 times greater than the p-type dopant concentration of P-- drain/source regions 331–332. The P+ regions are defined as regions having a p-type dopant concentration of about 1e20 atoms/cm$^3$ or greater.

The very low dopant concentration of the drain/source regions 331–332 results in a PMOS memory transistor P2 having a high threshold voltage $V_T$, and therefore a very low drain-source current $I_{DS}$. This advantageously enhances the stability of an SRAM cell fabricated using PMOS memory transistor P2.

Conversely, the relatively high dopant concentration of source/drain regions 341–342 and 361–362 results in a PMOS peripheral transistor P12 having a low threshold voltage, and therefore a high drain-source current $I_{DS}$. This advantageously provides the desired current driving capability to PMOS peripheral transistor P12.

In the described embodiment, NMOS and PMOS peripheral transistors N12 and P12 are fabricated in a manner consistent with a dual-gate process. That is, the NMOS peripheral transistor N12 is fabricated with N+ gate electrode 321, and PMOS peripheral transistor P12 is fabricated with P+ gate electrode 322.

In a preferred embodiment, both NMOS and PMOS memory transistors N2 and P2 are fabricated with N+ gate electrodes 323 and 324. A PMOS memory transistor having an N+ gate electrode has a higher threshold voltage ($V_T$) and a lower drain-source current ($I_{DS}$) than a similar PMOS memory transistor having a P+ gate electrode. Accordingly, the N+ gate electrode 324 of PMOS memory transistor P2 further weakens this transistor.

FIGS. 4A–4J are cross sectional views of a CMOS structure 300 during various stages of fabrication in accordance with one embodiment of the present invention. Persons skilled in the art will understand that some conventional fabrication steps have been omitted from this description so that the process is more clearly described.

As illustrated in FIG. 4A, CMOS structure 300 includes a monocrystalline semiconductor substrate 301. In the described embodiment, substrate 301 is a monocrystalline silicon wafer having a p-type dopant concentration in the range of about 1e14 to 1e16 atoms/cm$^3$. However, other embodiments may use other types of substrates 301. P-type well regions (P-wells) 302–303 and N-type well regions (N-wells) 304–305 are formed in substrate 301 using conventional CMOS processing steps. The dopant concentrations of P-wells 302 and 303 may be identical or may be different, depending on the desired transistor characteristics. The dopant concentrations of N-wells 304–305 may be similarly varied. In the described example, P-wells 302–303 have a dopant concentration on the order of 1e17 atoms/cm$^3$, and N-wells 304–305 have a dopant concentration on the order of 1e17 atoms/cm$^3$.

As described above, CMOS structure 300 includes a PERIPHERAL region, where peripheral transistors are fabricated, and a MEMORY region, where memory transistors are fabricated. In the example illustrated by FIGS. 4A–4J, an NMOS peripheral transistor is fabricated in P-well 302 and a PMOS peripheral transistor is fabricated in N-well 304 in the PERIPHERAL region. An NMOS memory transistor is fabricated in P-well 303 and a PMOS memory transistor is fabricated in N-well 305 in the MEMORY region.

Field dielectric regions 306 and 307 are fabricated in substrate 301 using conventional CMOS processing steps as illustrated in FIG. 4A. For example, field oxide regions 306–307 can be formed by local oxidation of silicon (LOCOS) or shallow trench isolation (STI) techniques. In the described embodiment, field dielectric regions 306–307 may have a thickness in the range of about 2000 to 6000 Angstroms.

Gate dielectric layer 308 is formed over the upper surface of substrate 301 using conventional CMOS processing steps. In the described embodiment, gate dielectric layer 308 may be a layer of silicon oxide having a thickness of about 10 to 200 Angstroms.

A layer of substantially undoped polycrystalline silicon (polysilicon) 309 is deposited over the resulting structure. In the described embodiment, polysilicon layer 309 has a thickness in the range of about 1000 to 4000 Angstroms. A layer of photoresist material is deposited over polysilicon layer 309. This photoresist layer is exposed and developed to create N+ polysilicon mask 311. N+ polysilicon mask 311 is defined to cover the regions where PMOS peripheral transistors are to be fabricated. Thus, in the described example, N+ polysilicon mask 311 is patterned to cover the region defined by N-well 304.

An N+ ion implant step is then performed through N+ polysilicon mask 311, thereby heavily doping the exposed portions of polysilicon layer 309 with an N-type dopant. In the described example, the N+ ion implant step is performed by implanting arsenic at an energy of about 50 KeV and a dosage of about 5e15 ions/cm$^2$. The resulting N+ regions in polysilicon layer 309 are illustrated in FIG. 4A. In the described example, the N+ polysilicon regions are doped to a concentration in the range of approximately $1 \times 10^{19}$ or more atoms per cubic centimeter (atoms/cm$^3$).

Turning now to FIG. 4B, the N+ polysilicon mask 311 is stripped, and another layer of photoresist is deposited over polysilicon layer 309. This photoresist layer is exposed and developed to create P+ polysilicon mask 312. P+ polysilicon mask 312 is defined to cover the regions where NMOS peripheral transistors, NMOS memory transistors and PMOS memory transistors are to be fabricated. Thus, in the described example, P+ polysilicon mask 312 is patterned to cover the regions defined by P-wells 302–303 and N-well 305.

A P+ ion implant step is then performed through P+ polysilicon mask 312, thereby heavily doping the exposed portions of polysilicon layer 309 with a P-type dopant. In the described example, the P+ ion implant step is performed by implanting boron at an energy of about 5 KeV and a dosage of about 1e15 ions/cm$^2$. The resulting P+ regions in polysilicon layer 309 are illustrated in FIG. 4B. In the described example, the P+ polysilicon regions are doped to a concentration in the range of approximately $1 \times 10^{19}$ or more atoms/cm$^3$. In other embodiments, the polysilicon layer 309 can be doped in different manners. Moreover, the number and sequence of the masking steps used to dope polysilicon layer 309 can be different in different embodiments.

As illustrated in FIG. 4C, the P+ polysilicon mask 312 is stripped, and an optional metal silicide layer 315 is formed over the upper surface of polysilicon layer 309 using conventional CMOS processing techniques. In the present example, the silicide layer 315 can be titanium silicide and/or cobalt silicide.

As illustrated in FIG. 4D, polysilicon layer 309 and silicide layer 315 are patterned to form polycide gate electrodes 321–324. This patterning is performed by forming a photoresist mask (not shown) over silicide layer 315, and etching the exposed portions of silicide layer 315 and polysilicon layer 309. Note that the polysilicon regions of polycide gate electrodes 321, 323 and 324 have N+ type dopant concentrations, and the polysilicon regions of gate electrode 322 has a P+ dopant concentration.

In another embodiment, a hard-mask process may be used to define gate electrodes 321–324. In such a process, a dielectric layer, which may consist of one or more materials, is deposited on metal silicide layer 315. This dielectric layer is then patterned using a photoresist mask. The photoresist mask is removed and the patterned dielectric layer is used as a mask for patterning the gate electrodes.

Figure 4E:
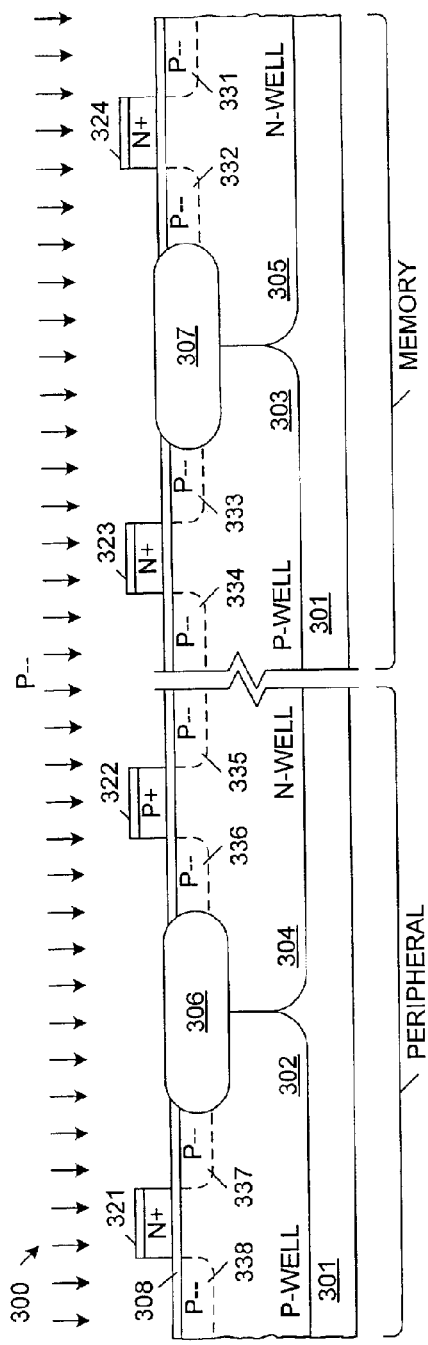

The CMOS structure illustrated by FIG. 4D can be fabricated without modifying a conventional CMOS process flow. However, FIG. 4E discloses an additional step that is not present in a conventional CMOS process flow.

As illustrated in FIG. 4E, a very light P−− blanket implant is performed over the entire structure of FIG. 4D. In the described embodiment, the very light P−− blanket implant is performed by implanting boron at an energy of about 5 KeV and a dosage of about 1e12 ions/cm$^2$. Alternately, the very light P−− blanket implant can be performed by implanting $BF_2$ at an energy of about 25 KeV and a dosage of about 1e12 ions/cm$^2$. For most applications an acceptable P−− blanket implant can be performed by implanting boron at an energy in the range of 1–30 KeV and a dosage of about 1e13 ions/cm$^2$ or less. Alternately, an acceptable P−− blanket implant can be performed for many applications by implanting $BF_2$ at an energy in the range of 5–150 KeV and a dosage of about 1e13 ions/cm$^2$ or less. Because the P−− blanket implant does not use a mask, all of the exposed areas receive the P−− dopant. As a result, P−− regions 331–338 are formed in substrate 301. More specifically, P−− regions 331–338 are formed in P-well regions 302–303 and N-well regions 305–304, as illustrated. The dopant concentration of P−− regions 331–338 is on the order of 1e17 atoms/cm$^3$ or less. A very lightly doped region is defined to have a dopant concentration on the order of 1e17 atoms/cm$^3$ for purposes of the present specification. This is significantly lower than the dopant concentration resulting from the subsequent conventional lightly doped drain (LDD) implant, which is on the order of 1e18–1e19 atoms/cm$^3$.

The dosage of the very light P−− blanket implant is sufficiently low that this implant does not cause any shift in the characteristics of the subsequently formed NMOS transistors. This is because the subsequently performed n-type LDD implant has a dose that is about 100 times higher than the very light P−− blanket implant dose. Because no additional mask is required to perform the very light P−− blanket implant, it is relatively easy to insert the very light P−− blanket implant step into the conventional CMOS process flow.

Figure 4F:
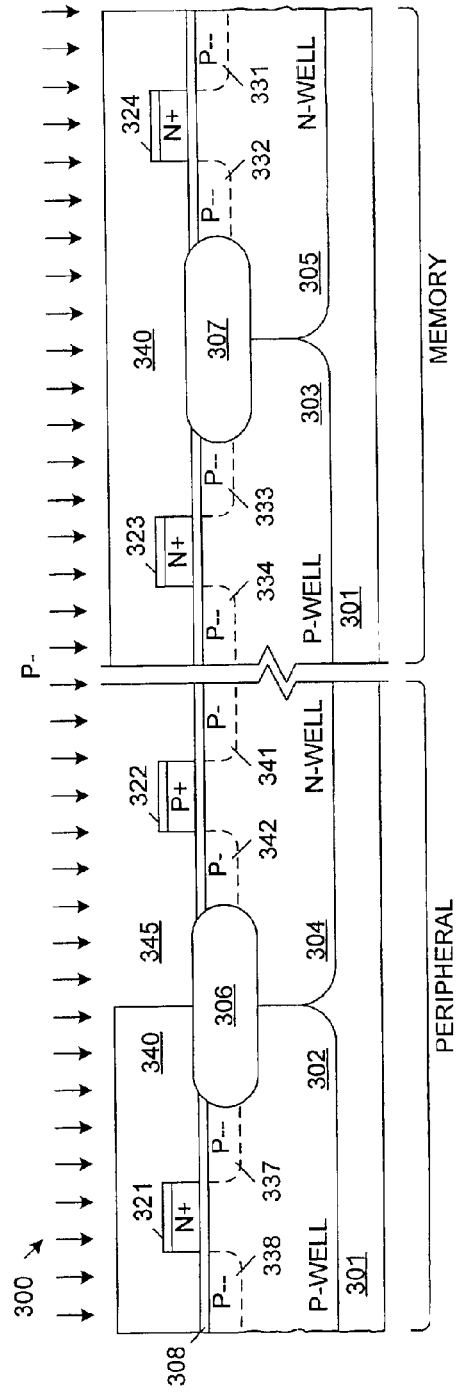

Turning now to FIG. 4F, photoresist mask 340 is formed over the resulting structure, thereby defining the locations to receive the P− LDD implant. P− LDD implant mask 340 includes openings, such as opening 345, which expose the locations where PMOS peripheral transistors are to be fabricated.

A P− LDD implant is performed through P− LDD implant mask 340, thereby forming P− lightly doped drain/source regions 341 and 342 of the PMOS peripheral transistor P12. The dosage of the P− LDD implant is selected such that the dopant concentration of the resulting P− LDD regions 341–342 have the same dopant concentration as a conventional P− LDD region. That is, the dosage of the P− LDD implant is selected such that the P− LDD implant plus the very light P−− blanket implant is equivalent to a single, conventional P− LDD implant. In the described example, the P− LDD implant is performed by implanting boron at an energy of about 5 KeV and a dosage of about 3e13 ions/cm$^2$. Alternately, the P− LDD implant can be performed by implanting $BF_2$ at an energy of about 25 KeV and a dosage of about 3e13 ions/cm$^2$. For most applications an acceptable P− LDD implant can be performed by implanting boron at an energy in the range of 1–30 KeV and a dosage of about 1e13–1e14 ions/cm$^2$ or less. Alternately, an acceptable P− LDD implant can be performed for most applications by implanting $BF_2$ at an energy in the range of 5–150 KeV and a dosage of about 1e13–1e14 ions/cm$^2$ or less.

P− LDD implant mask 340 is typically formed during a conventional CMOS process flow. However, in the past, P− LDD implant mask 340 also exposed the locations where the PMOS memory transistors are fabricated. However, in accordance with one embodiment of the present invention, the P− LDD implant mask 340 is modified to cover the locations were the PMOS memory transistors are fabricated. The PMOS memory transistors do not need to receive the P− LDD implant, because these transistors have already received drain/source doping during the P−− blanket implant.

Figure 4G:
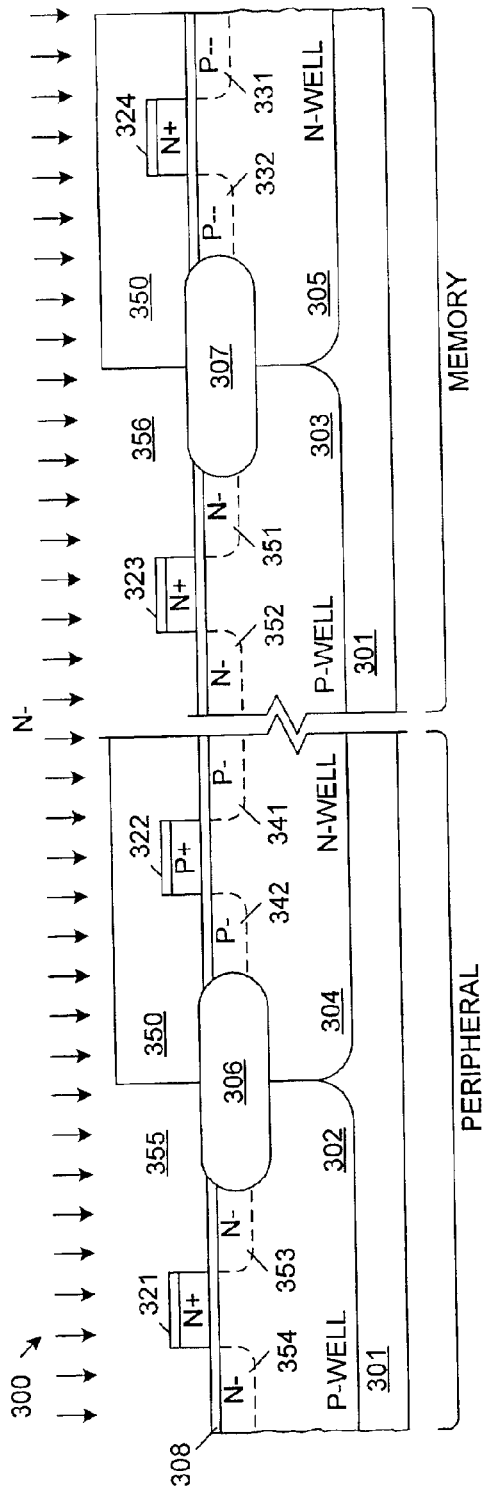

As illustrated in FIG. 4G, P− LDD implant mask 340 is stripped, and an N− LDD implant mask 350 is formed over the resulting structure. N− LDD implant mask 350 is a conventional mask in a standard CMOS process flow. N− LDD implant mask 350 includes openings, such as opening 355, which expose the locations where NMOS peripheral transistors are to be fabricated, and openings, such as opening 356, which expose the locations where NMOS memory transistors are to be fabricated. An N− LDD implant is performed through N− LDD mask 350, thereby forming N− LDD regions 351–352 of NMOS memory transistor N2 and N− LDD regions 353–354 of the NMOS peripheral transistor N12. As described above, the dose of the N− LDD implant is about 100 times greater than the dose of the very light P−− blanket implant. As a result, P−− type regions 333–334 and 337–338 become N-type regions 351–354. The dose of the N− LDD implant is selected such that the dopant concentration of the resulting N− regions 351–354 have the same dopant concentration as a conventional N− LDD region. In the described example, the N− LDD implant is performed by implanting arsenic at an energy of about 20 KeV and a dosage of about 5e14 ions/cm$^2$. For most applications, an acceptable implanting arsenic at an energy of about 5–50 KeV and a dosage of about 1e13–1e15 ions/cm$^2$. Alternately, phosphorus can be implanted at an energy of about 1–10 KeV and a dosage of about 1e13–1e14. The resulting dopant concentration of N− LDD regions 351–354 is in the range of about 1e18 to 1e20 atoms/cm$^3$.

Although the P−− blanket implant, the P− LDD implant and the N− LDD implant have been described in a particular order, it is understood that these three implants can be performed in any order, as long as these implants are completed before the formation of sidewall spacers adjacent to the gate electrodes 321–324.

Moreover, in addition to the above-described P− LDD and N− LDD implants, an N− halo implant (for PMOS) can be performed through P− LDD implant mask 340, and/or a P− halo implant (for NMOS) can be performed through N− LDD implant mask 350.

Figure 4H:
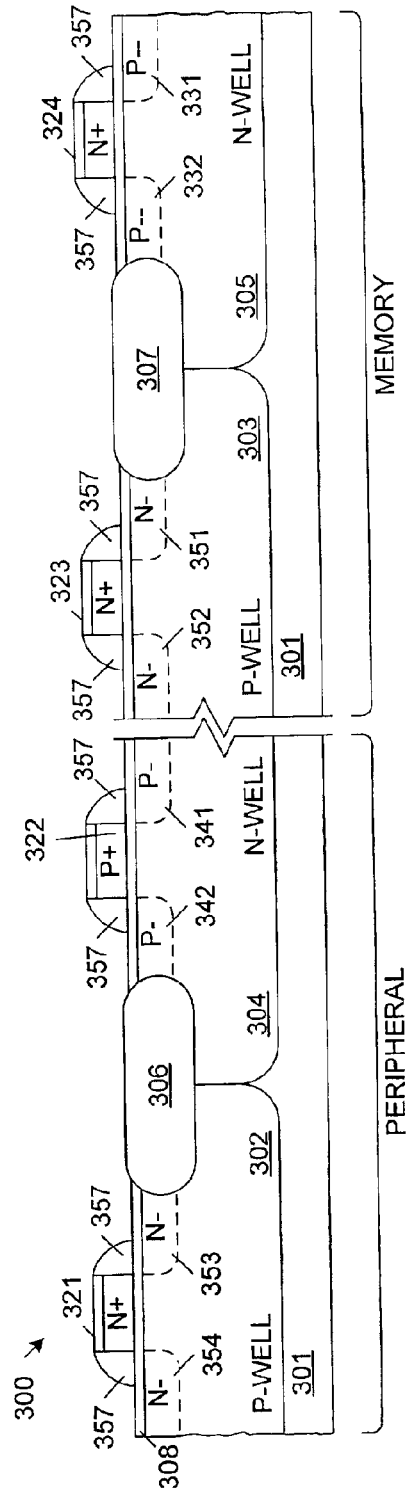

As illustrated in FIG. 4H, dielectric sidewall spacers 357 are formed at the sidewalls of gate electrodes 321–324 by depositing a dielectric layer (not shown) over the resulting structure, and then performing an etch-back. The formation of sidewall spacers 357 is a conventional step in a standard CMOS process flow. Although sidewall spacers 357 are formed by a single layer in the described example, these sidewall spacers can be formed by combinations of different dielectric layers, with different shapes for each layer. For example, when a sidewall spacer is formed by multiple layers, the underlying layers may have an "L" shape if the spacer etch-back is performed after depositing all of the dielectric layers.

Figure 4I:
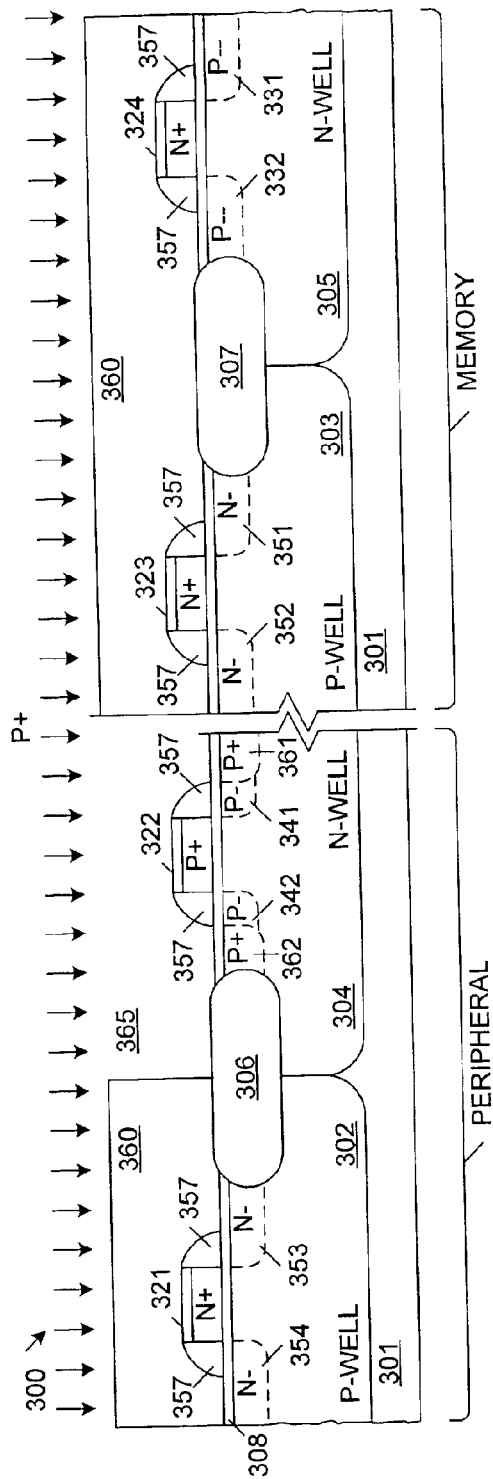

As illustrated in FIG. 4I, a P+ implant mask 360 is formed over the resulting structure. P+ implant mask 360 is a conventional mask used in a CMOS process flow. P+ implant mask 360 includes openings, such as opening 365, which expose the locations where PMOS peripheral transistors are to be fabricated. A P+ implant is performed through P+ implant mask 360, thereby forming heavily doped drain/source regions 361 and 362 of the PMOS peripheral transistor P12. The dosage of the P+ implant is selected such that the dopant concentration of the resulting P+ regions 361–362 have a dopant concentration in the range of about 1e20 atoms/cm$^3$ or more. In the described example, the P+ implant is performed by implanting boron at an energy of about 10 KeV and a dosage of about 1e15 ions/cm$^2$. Alternately, BF$_2$ can be implanted at an energy of about 50 KeV and a dosage of about 1e15 ions/cm$^2$. For most applications an acceptable P+ implant can be performed by implanting boron at an energy in the range of 1–20 KeV and a dosage of about 5e14–5e15 ions/cm$^2$. Alternately, an acceptable P+ implant can be performed for many applications by implanting BF$_2$ at an energy in the range of 5–100 KeV and a dosage of about 5e14–5e15 ions/cm$^2$. Note that P+ implant mask 360 covers all of the memory transistors, including PMOS memory transistor P2. As a result, the PMOS memory transistors do not receive the P+ implant.

Figure 4J:
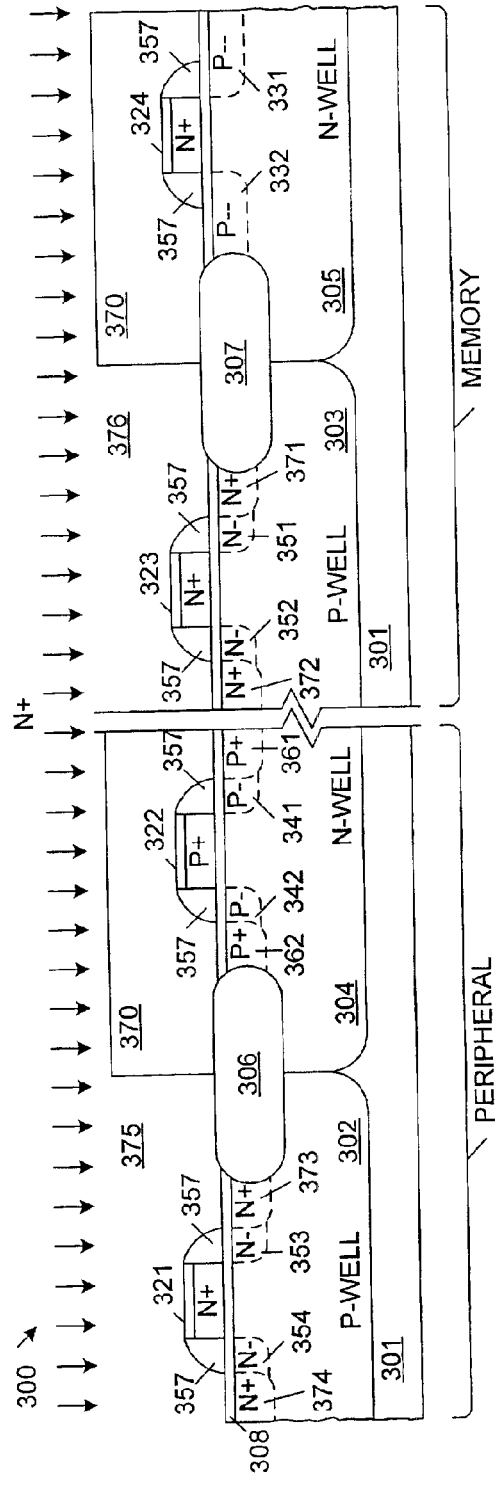

As illustrated in FIG. 4J, P+ implant mask 360 is stripped, and a N+ implant mask 370 is formed over the resulting structure. N+ mask is a conventional mask in a CMOS process flow. N+ implant mask 360 includes openings, such as opening 375, which expose the locations where NMOS peripheral transistors are to be fabricated, and openings, such as opening 376, which expose the locations where NMOS memory transistors are to be fabricated. A N+ implant is performed through N+ implant mask 370, thereby forming heavily doped N+ drain/source regions 371–372 of the NMOS memory transistor and heavily doped N+ drain/source regions 373–374 of the NMOS peripheral transistor. The dose of the N+ implant is selected such that the dopant concentration of the resulting N+ regions 371–374 is in the range of about 1e20 atoms/cm$^3$ or greater. In the described example, the N+ implant is performed by implanting arsenic at an energy of about 50 KeV and a dosage of about 5e15 ions/cm$^2$. For most applications an acceptable N+ implant can be performed by implanting arsenic at an energy in the range of 20–100 KeV and a dosage of about 1e15–1e16 ions/cm$^2$.

Although the N+ and P+ implants have been described in a particular order in the present embodiment, it is understood that in other embodiments, the N+ implant can be performed before the P+ implant.

Figure 2:
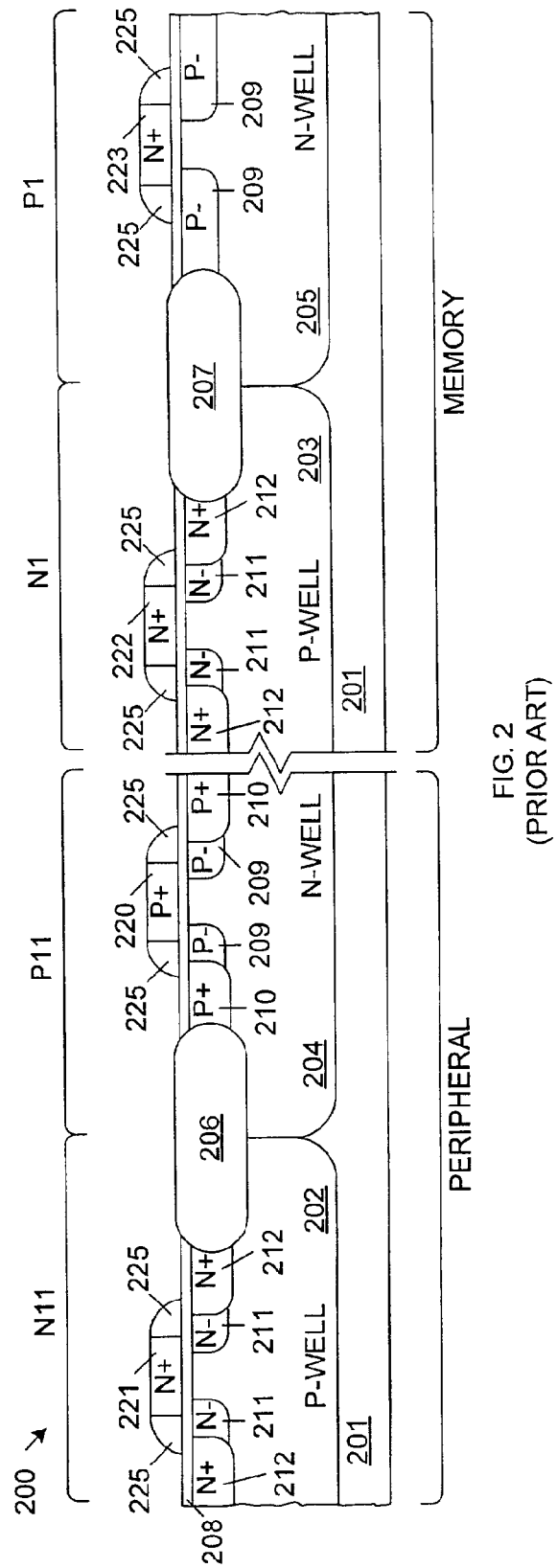
FIG. 2 is a cross-sectional diagram showing a CMOS structure typically used in the memory circuit of FIG. 1.

The N+ implant mask is stripped, and the CMOS process flow then continues with the formation of dielectric layers and interconnect layers (not shown). Annealing steps are performed at various stages of the process to activate and diffuse the above-described implanted impurities, thereby resulting in the CMOS structure 300 of FIG. 3. Advantageously, PMOS memory transistor P2 (FIG. 3) has a drain/source regions 331–332 that are more lightly doped than conventional PMOS memory transistors (e.g., PMOS memory transistor P1; FIG. 2). As a result, PMOS memory transistor P2 exhibits a higher threshold voltage and lower drain-source current ($I_{DS}$) when turned on than conventional PMOS memory transistors. This lower current $I_{DS}$ improves the stability of the SRAM cell fabricated from PMOS memory transistor P2. This lower current $I_{DS}$ also reduces the power consumption of an SRAM array fabricated using PMOS memory transistor P2.

PMOS memory transistor P2 (FIG. 3) may also be used to create an SRAM cell that has a smaller layout area than a conventional SRAM cell (e.g., an SRAM cell created using the PMOS memory transistor P1 of FIG. 2). In one embodiment, an SRAM cell constructed using PMOS memory transistor P2 of FIG. 3 has a layout area that is about 5–10 percent smaller than an SRAM cell constructed using PMOS memory transistor P1 of FIG. 2. As a result, the packing density is improved when SRAM cells are constructed using the PMOS memory transistor P2 of FIG. 3. This reduction in layout area can be described as follows. Looking at FIG. 1, the $I_{DS}$ ratio between NMOS memory transistor N3 and PMOS memory transistor P1, as well as the $I_{DS}$ ratio between NMOS memory transistor N4 and PMOS memory transistor P2, needs to be 2.0 or greater to ensure adequate stability and writing speed of SRAM cell 101. Because PMOS memory transistors P1 and P2 (FIG. 1) can be made weaker by the present invention, NMOS memory transistors N3 and N4 can be smaller in size, which in turn enables a use of smaller NMOS memory transistors N1 and N2 (FIG. 1). Thus, using the present invention, SRAM cell 101 can be made more stable at the same cell size. Alternately, the SRAM cell 101 can be made smaller at the same stability, resulting in a reduction in cell area of about 20 percent. By staying within the two extremes, SRAM cell 101 can be made both 5–10% smaller and more stable.

The relatively low doping of P-- regions 331–332 also advantageously causes PMOS memory transistor P2 to exhibit a greater punch-through margin and increased latch-up immunity than conventional PMOS memory transistors. Although the PMOS memory transistor P2 is a relatively slow device, this transistor P2 acts only as a load in the SRAM cell, and so does not significantly effect operating time.

Figure 5:
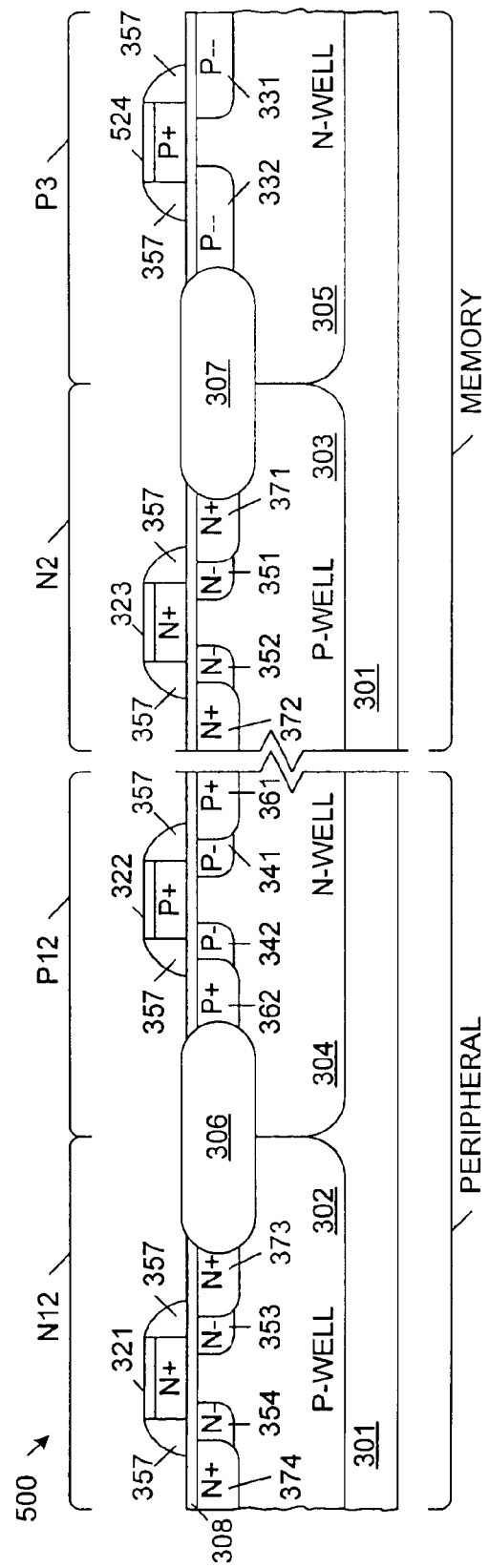
FIG. 5 is a cross sectional view of a CMOS structure that includes an improved set of transistors that may be used in the memory circuit of FIG. 1 in accordance with an alternate embodiment of the present invention.

Although the invention has been described in connection with several embodiments, it is understood that this invention is not limited to the embodiments disclosed, but is capable of various modifications, which would be apparent to a person skilled in the art. For example, although gate electrode 324 of PMOS memory transistor P2 is described as having an N type conductivity (because this conductivity type further weakens this transistor), it is understood that gate electrode 324 of PMOS memory transistor P2 can have a P type conductivity in other embodiments. This is especially true for a very cost-effective process where gates, source and drain are doped simultaneously after sidewall spacers are formed. FIG. 5 is cross sectional view of a CMOS structure 500 that is similar to CMOS structure 300 (FIG. 3), but includes a PMOS peripheral transistor P3 that has a gate electrode 524 having a P-type conductivity. Thus, the invention is limited only by the following claims.

What is claimed is:

1. An integrated circuit comprising:
   a memory cell including one or more PMOS memory transistors, wherein each of the PMOS memory transistors includes a gate electrode and very lightly doped drain/source regions that extend under the gate electrode; and
   a peripheral circuit coupled to the memory cell, the peripheral circuit including one or more PMOS peripheral transistors, wherein each of the PMOS peripheral transistors includes a gate electrode and lightly doped drain/source regions that extend under the gate electrode, and wherein the very lightly doped drain/source regions of the one or more PMOS memory transistors are more lightly doped than the lightly doped drain/source regions of the one or more PMOS peripheral transistors.

2. The integrated circuit of claim 1, wherein the memory cell is a six transistor (6-T) static random access memory (SRAM) cell, and one or more PMOS memory transistors comprise load transistors of the 6-T SRAM cell.

3. The integrated circuit of claim 1, wherein the very lightly doped drain/source regions of the one or more PMOS memory transistors have a dopant concentration of 1e17 atoms/cm$^3$ or less.

4. The integrated circuit of claim 3, wherein the lightly doped drain/source regions of the one or more PMOS peripheral transistors have a dopant concentration greater than 1e18 atoms/cm$^3$.

5. The integrated circuit of claim 3, wherein the lightly doped drain/source regions of the one or more PMOS peripheral transistors have a dopant concentration in the range of 1e18 to 1e19 atoms/cm$^3$.

6. The integrated circuit of claim 1, wherein the dopant concentration of the lightly doped drain/source regions of the one or more PMOS peripheral transistors is 2 to 100 times greater than the dopant concentration of the very lightly doped drain/source regions of the one or more PMOS memory transistors.

7. The integrated circuit of claim 1, wherein the dopant concentration of the lightly doped drain/source regions of the one or more PMOS peripheral transistors is 10 to 100 times greater than the dopant concentration of the very lightly doped drain/source regions of the one or more PMOS memory transistors.

8. The integrated circuit of claim 1, wherein the gate electrode of each of the one or more PMOS memory transistors has an N-type conductivity.

9. The integrated circuit of claim 8, wherein the gate electrode of each of the one or more PMOS peripheral transistors has a P-type conductivity.

10. The integrated circuit of claim 1, wherein the gate electrode of each of the one or more PMOS memory transistors and the gate electrode of each of the one or more PMOS peripheral transistors has a P-type conductivity.

11. The integrated circuit of claim 1, wherein each of the one or more PMOS peripheral transistors further comprises heavily doped drain/source regions continuous with the lightly doped drain/source regions.

12. The integrated circuit of claim 11, wherein each of the one or more PMOS peripheral transistors comprises sidewall spacers adjoining the gate electrodes, wherein the heavily doped drain/source regions are aligned with the sidewall spacers.

13. The integrated circuit of claim 1, wherein the memory cell further includes one or more NMOS memory transistors, each having heavily doped drain/source regions and lightly doped drain/source regions.

14. The integrated circuit of claim 13, wherein the peripheral circuit further includes one or more NMOS peripheral transistors, each having heavily doped drain/source regions and lightly doped drain/source regions.

15. The integrated circuit of claim 14, wherein the NMOS memory transistors and the NMOS peripheral transistors each have N-type gate electrodes.

16. The integrated circuit of claim 15, wherein the PMOS memory transistors have N-type gate electrodes and the PMOS peripheral transistors have P-type gate electrodes.

17. The integrated circuit of claim 15 wherein the PMOS memory transistors and the PMOS peripheral transistors have P-type gate electrodes.

* * * * *